(12) United States Patent
Alexiou et al.

(10) Patent No.: US 9,595,173 B2
(45) Date of Patent: Mar. 14, 2017

(54) MULTISTAGE TACTILE SOUND DEVICE

(71) Applicant: SubPac, Inc., Palo Alto, CA (US)

(72) Inventors: John Alexiou, Los Angeles, CA (US); Todd Chernecki, Los Angeles, CA (US); Sarosh S. Khwaja, Los Angeles, CA (US)

(73) Assignee: SubPac, Inc., Palo Alto, CA (US)

( * ) Notice: Subject to any disclaimer, the term of this patent is extended or adjusted under 35 U.S.C. 154(b) by 0 days.

(21) Appl. No.: 14/472,264

(22) Filed: Aug. 28, 2014

(65) Prior Publication Data

US 2015/0063606 A1 Mar. 5, 2015

Related U.S. Application Data

(60) Provisional application No. 61/991,831, filed on May 12, 2014, provisional application No. 61/919,020, filed on Dec. 20, 2013, provisional application No. 61/871,101, filed on Aug. 28, 2013.

(51) Int. Cl.

| | |
|---|---|
| *H04R 5/02* | (2006.01) |
| *G08B 7/06* | (2006.01) |
| *G08B 6/00* | (2006.01) |
| *H01L 41/09* | (2006.01) |
| *H01L 41/193* | (2006.01) |
| *H04R 17/00* | (2006.01) |

(52) U.S. Cl.
CPC ............... *G08B 7/06* (2013.01); *G08B 6/00* (2013.01); *H01L 41/0986* (2013.01); *H01L 41/193* (2013.01); *H04R 17/00* (2013.01); *H04R 2201/023* (2013.01); *H04R 2400/03* (2013.01)

(58) Field of Classification Search
CPC .......... H04R 2201/023; H04R 2400/03; H04R 2460/13; H04R 1/025; H04R 2440/05; A61F 11/04; H04S 2400/07; A61H 23/0236
USPC .......................................... 381/151
See application file for complete search history.

(56) References Cited

U.S. PATENT DOCUMENTS

| | | | | |
|---|---|---|---|---|
| 3,674,945 | A | | 7/1972 | Hands |
| 4,064,376 | A | * | 12/1977 | Yamada ............ A61H 23/0218 297/217.4 |
| 4,136,685 | A | * | 1/1979 | Ramey .............................. 5/915 |
| 4,354,067 | A | * | 10/1982 | Yamada et al. ............... 381/413 |
| 4,807,294 | A | | 2/1989 | Iwata et al. |

(Continued)

FOREIGN PATENT DOCUMENTS

WO         9962295  A1    12/1999

OTHER PUBLICATIONS

Horton, D., AVSIM Hardware Review: Aura Interactor, AVSIM Online, 2004 (retrieved on Nov. 5, 2014). http://www.avsim.com/pages/0604/aura/aura_Interactor.htm; figure 3, p. 2, paragraph 1-5; p. 3, paragraphs 1-4; p. 4, paragraph 3.

(Continued)

*Primary Examiner* — Curtis Kuntz
*Assistant Examiner* — Ryan Robinson
(74) *Attorney, Agent, or Firm* — Fenwick & West LLP

(57) ABSTRACT

A tactile sound device in proximate contact with a user, comprising a multistage arrangement of vibrotactile materials to impart visceral sensations to a user. The device imparts a physical sensation via a multistage arrangement of vibrotactile materials embodied in a wearable or seated configuration, in response to a wired or wireless signal input.

50 Claims, 7 Drawing Sheets

(56) References Cited

U.S. PATENT DOCUMENTS

| | | | |
|---|---|---|---|
| 5,060,527 A | 10/1991 | Burgess | |
| 5,553,148 A * | 9/1996 | Werle | H04R 5/023 |
| | | | 381/151 |
| 5,565,840 A * | 10/1996 | Thorner | A63F 13/02 |
| | | | 340/323 R |
| 6,004,209 A * | 12/1999 | Katsumoto et al. | 463/30 |
| 6,626,341 B2 * | 9/2003 | Mitchell | A45F 3/04 |
| | | | 224/576 |
| 6,694,035 B1 | 2/2004 | Teicher et al. | |
| 6,712,249 B2 * | 3/2004 | Magnusson et al. | 224/576 |
| 6,752,716 B1 * | 6/2004 | Nishimura | A63F 13/08 |
| | | | 273/148 B |
| 7,440,581 B2 * | 10/2008 | Wiener | 381/388 |
| 7,553,288 B2 * | 6/2009 | Cohen | A61H 23/0236 |
| | | | 181/144 |
| 7,798,982 B2 * | 9/2010 | Zets et al. | 601/78 |
| 8,139,803 B2 | 3/2012 | Afshar | |
| 8,308,558 B2 * | 11/2012 | Thorner | 463/30 |
| 8,317,734 B1 | 11/2012 | Redfield | |
| 8,638,966 B2 * | 1/2014 | Taylor | G10H 1/0008 |
| | | | 381/301 |
| 8,668,045 B2 * | 3/2014 | Cohen | A61H 23/0236 |
| | | | 181/150 |
| 8,965,032 B2 * | 2/2015 | Wolfe | 381/384 |
| 8,995,692 B2 * | 3/2015 | Efrati | H04R 3/12 |
| | | | 381/151 |
| 2004/0155512 A1 * | 8/2004 | Nakamura | B29C 44/12 |
| | | | 297/452.26 |
| 2007/0217644 A1 | 9/2007 | LeDonne | |
| 2011/0251535 A1 | 10/2011 | Bender | |
| 2011/0257468 A1 | 10/2011 | Oser et al. | |
| 2012/0035513 A1 | 2/2012 | Afshar | |
| 2012/0051579 A1 | 3/2012 | Cohen | |
| 2013/0005214 A1 * | 1/2013 | Davies | A61H 23/02 |
| | | | 446/397 |
| 2013/0202134 A1 * | 8/2013 | Afshar | H04R 1/22 |
| | | | 381/151 |
| 2015/0146892 A1 * | 5/2015 | Watanabe | 381/151 |

OTHER PUBLICATIONS

Rayner, B., "Subpac Music Gadget Shakes Up Music-listening Experience", Toronto Star, Apr. 7, 2013 (Retrieved on Nov. 4, 2014), Retieved from the Internet: http://www.thestart.com/life/technology/2013/04/07/subpac_music_gadget_shakes_up_musiclist_ening_experience.html; entire document.

PCT International Search Report and Written Opinion, Application No. PCT/US14/53277, Nov. 21, 2014, 20 pgs.

"Marvel Avengers Vybe Haptic Gaming Pad from Comfort Research and Marvel Entertainment," Nov. 29, 2012, 2 pages, [Online] [Retrieved on Dec. 9, 2016] Retrieved from the Internet<URL:http://comfortresearch.com/marvel-avengers-vybe-haptic-gaming-pad-from-comfort-research-and-marvel-entertainment/>.

Archive of "ButtKicker®," The Guitammer Company, www.thebuttkicker.com, [Online] [Archived by http://archive.org on Apr. 5, 2013; Retrieved on Dec. 9, 2016] Retrieved from the Internet<URL: https://web.archive.org/web/20130405034122/http://www.thebuttkicker.com/>.

* cited by examiner

MULTISTAGE TACTILE SOUND DEVICE

CROSS-REFERENCE TO RELATED APPLICATIONS

The present application claims priority benefit under 35 §119(e) of U.S. Provisional Patent Application No. 61/871,101, entitled "Tactile Sound Device," filed Aug. 28, 2013, the contents of which are incorporated herein by reference in their entirety; of U.S. Provisional Patent Application No. 61/919,020, entitled "Wearable Tactile Sound Device," filed Dec. 20, 2013, the contents of which are incorporated herein by reference in their entirety; and of U.S. Provisional Patent Application No. 61/991,831, entitled "Wearable Tactile Sound Device," filed May 12, 2014, the contents of which are incorporated herein by reference in their entirety.

TECHNICAL FIELD

The present invention relates generally to a tactile sound device. More particularly, the present invention relates to a tactile sound device comprising a multistage arrangement of vibrotactile materials to impart visceral sensations to a user. Specifically, the present invention relates to imparting a physical sensation via a multistage arrangement of vibrotactile materials embodied in wearable or seated setups in response to a wired or wireless electrical signal input.

BACKGROUND

For literally hundreds of years, people have enjoyed music, both playing the music and listening to the music. In recent years, the types of music available for listening has expanded exponentially, as has the equipment by which the user can listen to the music. Often, the equipment by which a user can hear, or listen to, the music can be located in the same room where the user is located and the playback of the music can be controlled by the user.

SUMMARY

According to certain embodiments, there is provided a tactile sound device aimed at providing a visceral sensation via a multistage vibrotactile membrane. The inventors of the present invention have discovered that the type, density, shape and arrangement of various materials employed as vibrotactile membranes in a tactile sound device greatly affects the transfer of a visceral sensation and the overall subjective user experience, despite the fact that the same electroactive transducers, electrical components and other settings may remain constant. Particular embodiments therefore comprise specific arrangements and types of vibrotactile materials that optimize the vibratory field of a tactile sound device to provide the highest level of subjective user experience. Certain embodiments provide for an optimal vibratory field for users who have their back placed against the tactile sound device.

In one embodiment, a tactile sound device is provided intended for use in a seated position, wherein of the tactile sound device is a textile, polymer or plastic enclosure. Other embodiments include straps to secure the sound device or enclosure to a chair, and clasps to integrate into seats specifically designed for the sound device or enclosure. In another embodiment, a self-contained tactile sound device is provided that can be embedded inside a seat (for instance a computer chair or a car seat), either during the time of manufacture or after sale of the sound device.

In a particular embodiment, a tactile sound device is provided for use with the user in a standing position, the tactile sound device having a textile, polymer or plastic enclosure with straps. Another embodiment provides a tactile sound device integrated into a backpack on the side proximal to the wearer's back. Yet another embodiment is provided wherein a tactile sound device can be inserted into the sleeve of a backpack. A further embodiment is provided wherein a tactile sound device can be snapped onto a backpack or garment on the side of the backpack or garment that is proximal to the wearer's back, utilizing clasps designed for that purpose. Another embodiment is provided wherein a purpose-built bag containing a tactile sound device has a mechanism to snap on a storage compartment to form a full backpack. A further embodiment provides a tactile sound device that can strap onto any backpack.

In certain embodiments, a tactile sound device vest is provided, including one or more units of multistage tactile membranes to provide a visceral sensation on the front, back and/or sides of the wearer. Another embodiment is provided where one or more multistage tactile membranes can be incorporated into multiple positions in or on a garment. Yet another embodiment is a multipurpose tactile sound device insert that can be integrated into other garments, devices, or products.

In accordance with certain embodiments, there is provided a visceral sensation to the user through the sound device in response to output of bass frequencies at a live event. Additional embodiments for providing a visceral sensation is a wearable tactile audio device that receives input signals from integrated or modular wireless connections, or via a wired connection, such as USB protocol.

BRIEF DESCRIPTION OF THE DRAWINGS

The accompanying drawings, which are incorporated herein and form part of the specification, illustrate various embodiments of the present disclosure and, together with the description, further serve to explain the principles of the disclosure and to enable a person skilled in the pertinent art to make and use the embodiments disclosed herein. In the drawings, like reference numbers indicate identical or functionally similar elements.

DETAILED DESCRIPTION

Particular embodiments are directed to the type, density, shape and arrangement of various materials employed as vibrotactile membranes in a tactile sound device for affecting the transfer of a visceral sensation for providing an overall subjective user experience, despite the fact that the same electroactive transducers, electrical components and other settings may remain constant. Present embodiments therefore comprise a specific arrangement and types of vibrotactile materials that optimize the vibratory field of a tactile sound device to provide the highest level of subjective user experience. The present invention thereby facilitates providing an optimal vibratory field for users who have their back placed against the tactile sound device.

Figure 1:
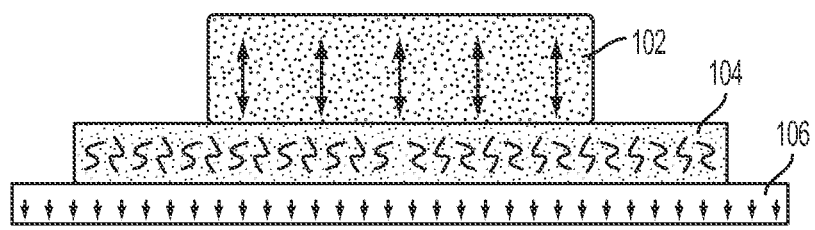
FIG. 1 illustrates s a side view of the multistage vibrotactile membrane assembly.

The key to a sought-after improved user experience is the use of a multistage vibrotactile membrane 100 as shown in FIG. 1. The conduction of vibration commences with the electroactive transducer 102, which can be a tactile transducer, a piezoelectric transducer or any mechanism that translates an electric signal into motion. The electroactive transducer 102 directly attaches to the secondary membrane 104 or can be embedded in it. The secondary membrane attaches to the primary membrane 106 which is the side proximal to the user. The vibrations from the electroactive transducer 102 are dampened by the secondary membrane 104 and dissipated across its surface area. The primary membrane 106 then collects and transfers the vibrations to the user's back through the cover or coating material.

The primary membrane 106 comprises a large, rigid membrane that takes up approximately the same surface area as the side of the tactile sound device proximal to the user's back and also serves a structural role in the invention. Primary membrane 106 may be made of any of a number of thermoplastics, such as polypropylene, HDPE, PVC, and the like, or of composite materials, such as carbon-fibre; but a preferred material is polypropylene. It is important to note that only textiles, thin foams, silicone or other such coatings should be placed between primary membrane 106 and the user's body to minimize any interference or undesirable vibrational dampening between the user and the primary membrane 106.

Figure 2:
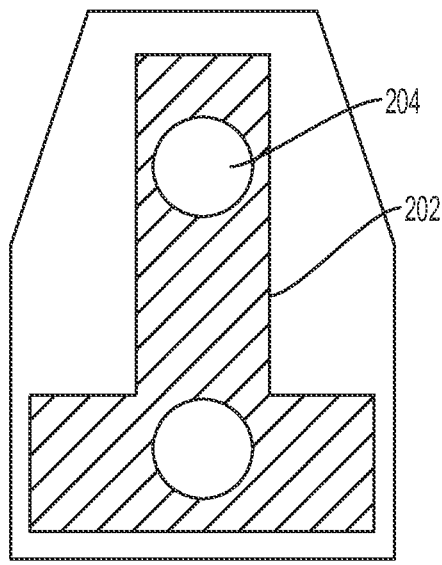
FIG. 2 illustrates a top view of a multistage vibrotactile membrane assembly for a seated configuration.
Figure 3:
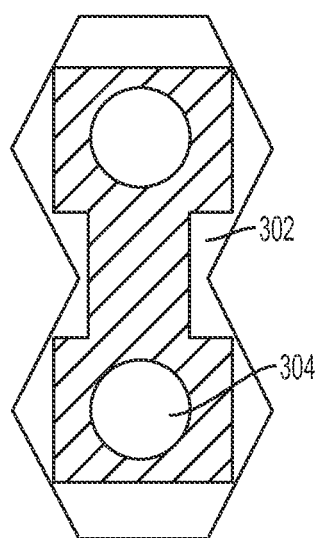
FIG. 3 illustrates a top view of a multistage vibrotactile membrane assembly for a wearable configuration.

This secondary microcellular polymer membrane 104 may be made of microcellular elastomers (EVA), urethanes (PU), rubbers, and the like; but is preferably comprised of microcellular polyurethane, which has a greater dampening effect on vibrations (vis-à-vis the primary membrane 106). Such dampening effect is desirable to reduce the harsh vibrations of the electroactive transducer 102 to a level that is comfortable to the user and that distributes them across the area of the microcellular foam. The secondary microcellular polymer membrane 104 should contain less surface area than the primary membrane 106 and is preferably provided in an inverted "T" shape 202 as shown in FIG. 2 if the device is to be used in a seated orientation (i.e. the horizontal portion goes across the user's pelvis/posterior pelvis, with the vertical portion up the user's spine and in between the shoulder blades). Ideally, at least one electroactive transducer 204 should be placed on each axis of the inverted "T" 202 (however one tactile electroactive transducer 204 could be used). This arrangement 202 concentrates the transfer of motion along the user's spine and lower back. If, however, the tactile sound device is to be used in a standing position, then the secondary microcellular polymer membrane 104 is preferably provided in an "I" shape 302 as shown in FIG. 3 (such that it fits along the spine and in between the shoulder blades of a user). In the "I" shape, a single electroactive transducer 304 can be attached, but preferably two electroactive transducers 304 are utilized. This arrangement 302 concentrates the transfer of motion along the user's back.

Note that the primary membrane 106 and the secondary membrane 104 can be combined with one or more layers of similar materials or into a composite material to provide a more controlled gradient of dissipation and transmission. Another layer of materials similar to the primary membrane 106 larger in surface area than the electroactive transducer 102 be used in order to alter the vibratory field of the electroactive transducer 102. The membranes and the electroactive polymers should be attached using a strong adhesive, such as VHB tape.

Figure 4:
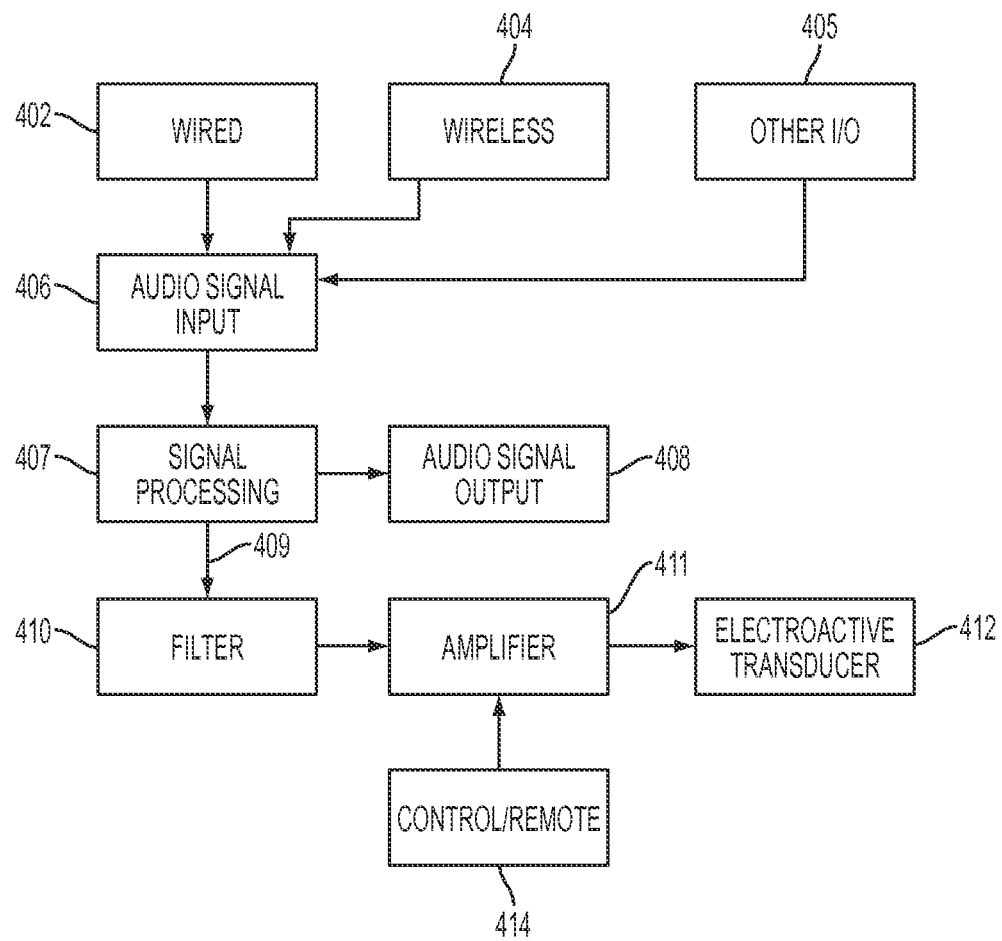
FIG. 4 is a flowchart illustrating the flow of signals processed by a tactile sound device to provide visceral sensation to the user in response to audio input.
Figure 5:
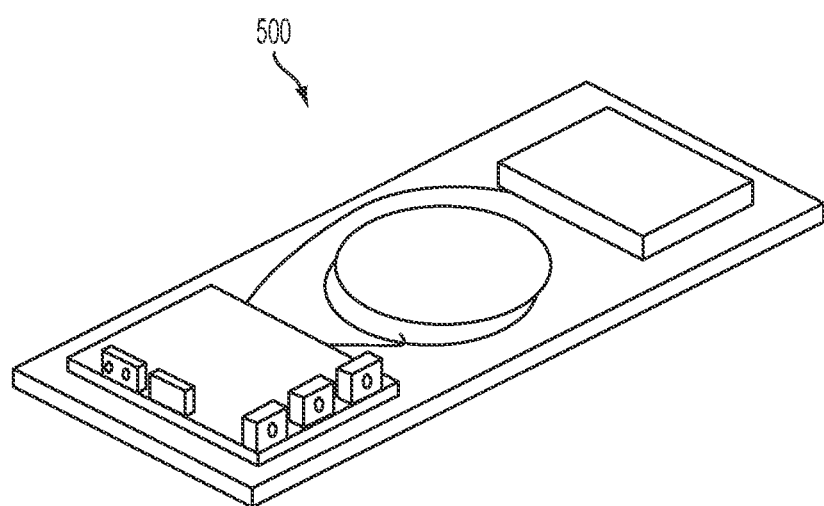
FIG. 5 illustrates a perspective view of a circuit board in accordance to the embodiment FIG. 4.

The multistage vibrotactile membrane 100 can be run off an external amplifier; however, in a preferred embodiment, the tactile sound device is supplied with its own circuit assembly. This assembly of the multistage tactile membrane and circuit assembly is hereinafter referred to as 500. This circuit assembly 400 is shown in FIG. 4 and FIG. 5. The unit receives a wired 402 or wireless 404 audio signal input 406. An I/O Port 405 can be used to provide input from other sources, for instance USB audio input. One part of this signal is either processed or directly passed 407 through to a headphone output 408. Another part of this signal 409 is filtered 410 (for example using a low pass filter) to remove frequencies above the frequency response range of the electroactive transducers 412. This signal is sent to an amplifier 411 (for example an Class D amplifier) which then powers one or more electroactive transducers 412. The vibrotactile response can is attenuated or amplified using a control either on the unit or on a remote 414. The unit is powered via a battery which is charged via a DC power input. This embodiment of the tactile sound device containing the tactile sound device and its own circuit assembly 500 can be used in seated and wearable configurations.

To provide an accurate representation of sound information, for example for music production, the signal 409 is passed from the Digital Signal Processor 407 to 410 unprocessed. To provide an enhanced representation of sound information, compression and bass-boost effects, for gaming and entertainment applications for instance, can be applied in 407 to be passed into 410. To provide car-engine feedback sounds, for instance to simulate the sensation of driving a combustion-engine car in an electric car, an electrical signal based on environmental criteria via external processing can be sent to 405 and effects can be applied 407 to further enhance that experience.

Figure 6:
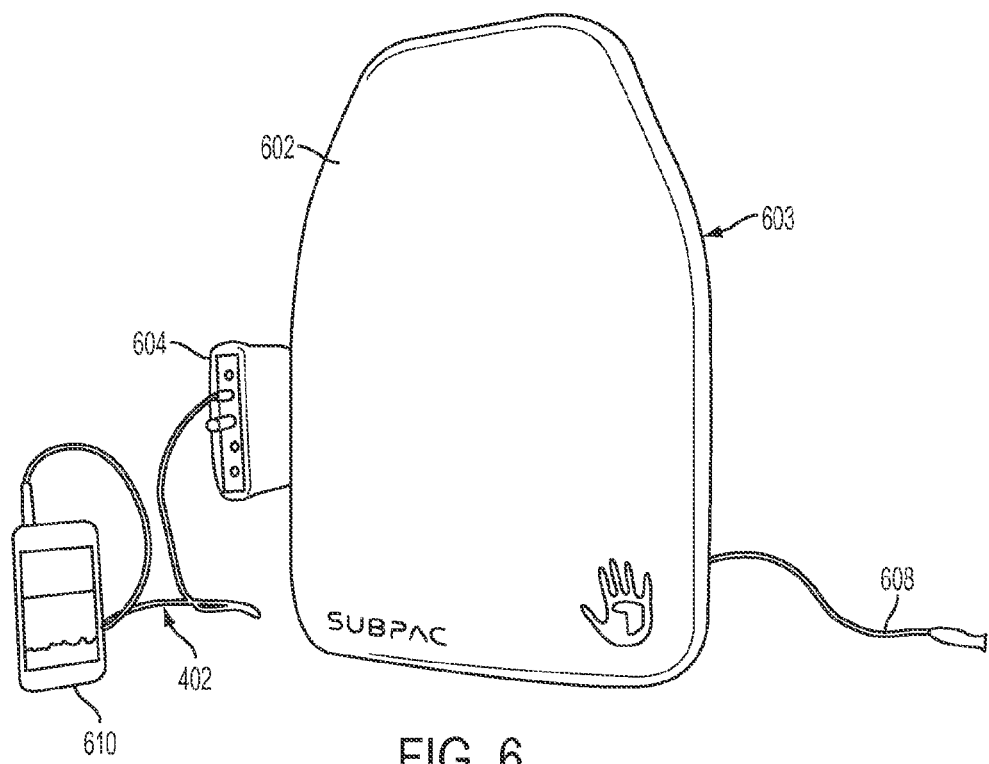
FIG. 6 illustrates a perspective view of a tactile sound device for use in a seated configuration.

FIG. 6 shows an embodiment, for a seated configuration where the tactile sound device can be placed on any chair. The main body 602 comprises the vibrotactile membrane assembly 100 (not shown) inside a textile cover 603. This circuit assembly 604, 414 is outside the unit; however it can be integrated in the main unit 602 as well. Signal input is provided via a wired connection 402 from a portable media player 610. The unit is powered via a DC power connector 608. In another embodiment (not shown) of tactile sound device 500, the rear the unit has buckles that can snap into a chair with matching clasps designed to accommodate such a unit. In another embodiment, (not shown), the tactile sound device 500 is integrated into the back of a chair with the tactile sound device 500 (not shown) on the side of the chair back 802 proximal to the user's back.

Figure 7:
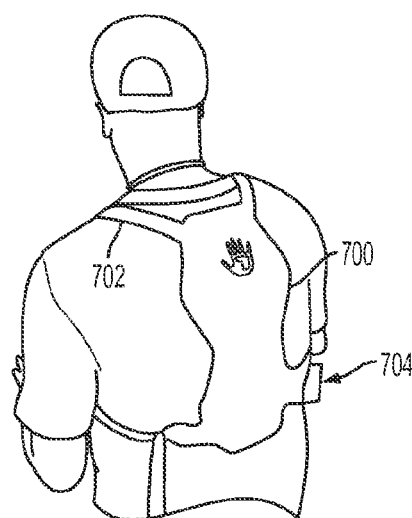
FIG. 7 illustrates a perspective view of a tactile sound device for use in a wearable configuration.
Figure 8:
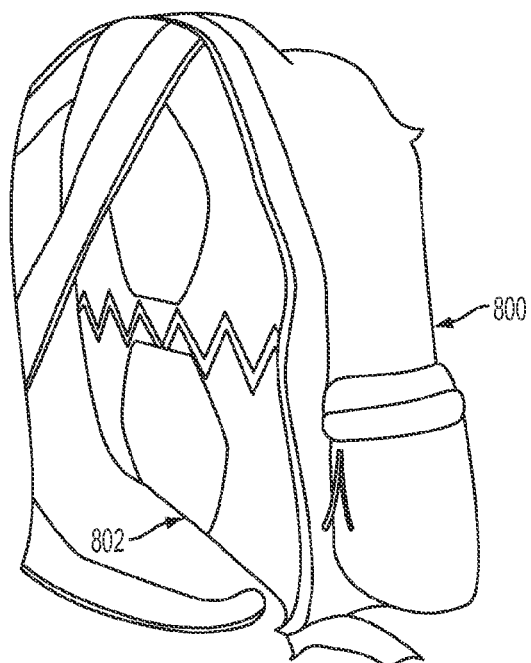
FIG. 8 illustrates a perspective view of a tactile sound device for use in a backpack configuration.
Figure 9:
FIG. 9 illustrates a perspective view of a tactile sound device for use in a vest configuration.

FIG. 7 shows an embodiment of the tactile sound device 500 (not shown) incorporated in a purpose built wearable bag 700 with straps 702. A control module 704 is configured to attenuate or amplify the vibrotactile response. Headphones are plugged into the headphone out 408. FIG. 8 shows an embodiment of the tactile sound device 500 (not shown) is sealed into a backpack 800 on the side proximal to the wearer's back 802. Various embodiments and details of features of tactile sound device backpacks are discussed in U.S. Provisional Application Ser. No. 61/991,831. FIG. 9 shows a tactile sound device vest 900 incorporating four units of multistage tactile membrane 100 (not shown) and a circuit assembly 400 to power the device.

Figure 10:
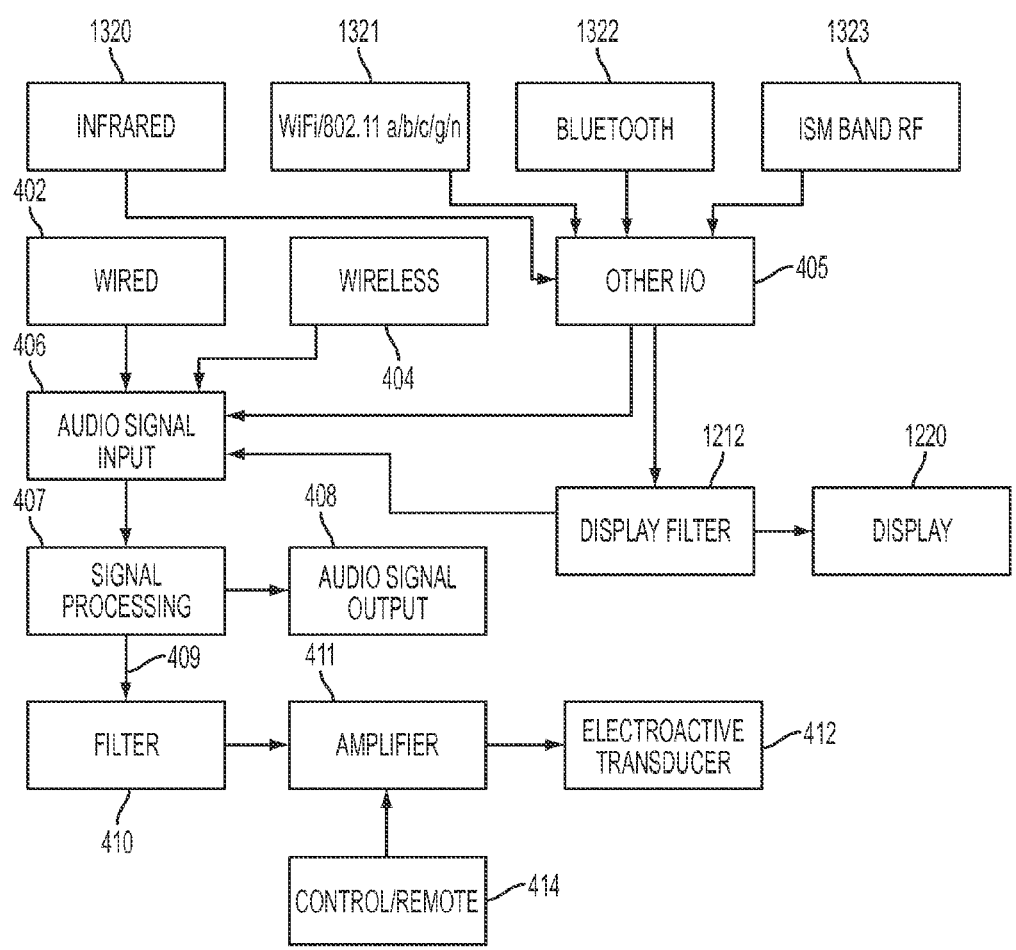
FIG. 10 is a flowchart illustrating the flow of signals processed by a tactile sound device to provide visceral tactile sensations to the user in response to sound at a live event.

FIG. 10 shows the circuit block diagram of an embodiment of a wearable tactile sound device to be used at a live event. This unit receives a source signal, via an integrated or a modular receiver, and translates the low frequencies contained therein directly to the wearer's/audience member's body. The audience member thus experiences the visceral sensation of loud sub-woofers, without experiencing the pressure waves caused by sound. This allows all audience members who wear the device of the present invention to experience the same visceral experience, regardless of physical proximity to the sound source. The method for providing visceral tactile sensations to the user in response to sound at a live event are found in U.S. Provisional Application Ser. No. 61/919,020 and U.S. Provisional Application Ser. No. 61/871,101. A display, 1220 is present on the exterior shell of tactile sound device and can take signals from 1320, 1321, 1322, 1323, via 405 to create a centrally controlled tight-show (for instance controlled by a DJ), a pre-programmed light-show (for instance using information from 405) or a light show based on characteristics of input signal 406 or output signal 412.

What is claimed is:

1. A tactile device, comprising:
   one or more layers of primary membrane of a vibrotactile assembly, the primary membrane adapted to be proximal to a user;
   one or more layers of secondary membrane of the vibrotactile assembly, the secondary membrane in an inverted T shape and attached to said primary membrane; and
   one or more discrete or continuous electroactive components that translate an electrical signal into motion, the electroactive components attached along or embedded into a portion of the secondary membrane,
   the secondary membrane being between the electroactive components and the primary membrane, and the secondary membrane dampening and dissipating the motion from the electroactive components along a surface area of the secondary membrane, and
   the primary membrane adapted to collect and transfer the damped and dissipated motion from the secondary membrane to the user.

2. The tactile device according to claim 1, wherein the primary membrane comprises a thermoplastic or composite material.

3. The tactile device according to claim 1, wherein the primary membrane comprises one or more of polypropylene, HDPE, PVC, or carbon-fibre.

4. The tactile device according to claim 1, wherein the primary membrane comprises polypropylene.

5. The tactile device according to claim 1, wherein the secondary membrane comprises a microcellular elastomer, urethane, or rubber.

6. The tactile device according to claim 1, wherein the secondary membrane comprises polyurethane.

7. The tactile device according to claim 1, wherein the electroactive component is powered by an amplifier.

8. The tactile device according to claim 1, wherein the electroactive component is controlled by a wired electrical signal.

9. The tactile device according to claim 1, wherein the electroactive component is controlled by an electrical signal transmitted wirelessly.

10. The tactile device according to claim 1, wherein the electroactive component comprises an active or passive filter to control the frequency response range of the vibrotactile assembly.

11. The tactile device according to claim 1, wherein the vibrotactile assembly is controlled by at least a circuit assembly that processes and amplifies an audio or electric signal into a control signal to activate the electroactive components.

12. The tactile device circuit assembly according to claim 11, wherein the circuit assembly comprises:
    one or more wired or wireless audio or electrical signal input; and
    at least a signal amplifier to control, at least in part, providing power to the circuit assembly and the vibrotactile assembly.

13. The tactile device according to claim 11, wherein the circuit assembly attenuates the amplifier output for the electroactive component and/or filters the amplifier output.

14. The tactile device according to claim 11, wherein the circuit assembly comprises at least one microprocessor to control one or more functions of the circuit assembly.

15. The tactile device according to claim 11, wherein the circuit assembly comprises at least one digital signal processor to alter all or certain portions of the audio or the electrical signal.

16. The tactile device according to claim 11, wherein the circuit assembly comprises at least one filter, wherein the filter comprises at least one of a low pass, high pass, notch filter or band pass filter.

17. The tactile device according to claim 11, wherein the circuit assembly comprises at least one filter for processing the control signal to remove distortion or noise.

18. The tactile device according to claim 11, wherein the circuit assembly receives an infrared or a wireless signal input using at least one of WiFi, Bluetooth, UHF, and ISM protocols.

19. The tactile device according to claim 11, wherein the circuit assembly comprises a wired signal input and a processor to decode input from another device in an encoded format.

20. The tactile device according to claim 11, wherein the circuit assembly accepts a microphone input.

21. The tactile device according to claim 11, wherein the circuit assembly provides a wired or wireless audio signal output.

22. The tactile device according to claim 11, wherein the circuit assembly attenuates or amplifies a wireless or wired audio signal output.

23. The tactile device according to claim 11, wherein the circuit assembly comprises a primary cell or secondary cell assembly.

24. The tactile device according to claim 11, wherein the circuit assembly comprises a charging circuit for a secondary cell assembly.

25. The tactile device according to claim 11, wherein the circuit assembly comprises an I/O port to which internal or external accessories can be attached.

26. The tactile device according to claim 11, wherein the circuit assembly comprises an I/O port that can power or charge external devices and accessories.

27. The tactile device according to claim 11, wherein the circuit assembly comprises a system to separate the control signal used to activate the electroactive component from a signal to control other components and functions of the circuit assembly.

28. The tactile device according to claim 27, wherein the intensity of the control signal to activate the electroactive component can be controlled via an external signal.

29. The tactile device according to claim 1, wherein the tactile device is situated inside a textile, synthetic, leather, polymer or foam cover.

30. The tactile device according to claim 29, wherein the cover comprises straps to secure the device to a seat, wherein the seat comprises a computer chair, a theatre chair, a car seat, or an airplane seat.

31. The tactile device according to claim 29, wherein the cover includes a mechanism to snap the device to any seat designed to accommodate such a device.

32. The tactile device according to claim 29, wherein the tactile device is embedded inside a seat such as a computer chair, theatre chair, car seat, or airplane seat on the side proximal to the user's back.

33. The tactile device according to claim 1, wherein tactile device is situated inside a purpose-built bag having a pair or more of straps or a single cross-strap, the bag to be worn by the user.

34. The tactile device according to claim 1, wherein the tactile device is sealed inside a backpack on the side proximal to the wearer's back.

35. The tactile device according to claim 1, wherein the tactile device is situated to be inserted into an unsealed pocket of a backpack on the side proximal to the wearer's back.

36. The tactile device according to claim 1, wherein the tactile device can be snapped onto the exterior of a backpack on the side of the backpack proximal to the wearer's back.

37. The tactile device according to claim 33, wherein the purpose-built bag has a mechanism to snap on a storage compartment to form a full backpack.

38. The tactile device according to claim 33, wherein tactile device is configured to be strapped onto any backpack.

39. The tactile device according to claim 1, wherein the tactile device is configured to be worn by the user as a vest or within a vest.

40. The tactile device according to claim 1, wherein tactile device is configured to be worn by the user as a garment.

41. The tactile device according to claim 1, wherein tactile device is configured as an insert to be inserted into any garment worn by the user.

42. The tactile device according to claim 1, wherein the tactile device is configured to display visualizations via a display on a cover or enclosure of the tactile tactile device, wherein the visualizations are either generated on the device or are received from wired or wireless signal, and wherein the display comprises an OLED screen, flexible OLED screen, LED grid, LED screen, LCD screen, or electroluminescent display.

43. The tactile device according to claim 11, wherein a digital signal processor in the circuit assembly provides a faithful representation of audio input by not modifying the input signal.

44. The tactile device according to claim 11, wherein a digital signal processor in the circuit assembly provides an enhanced representation of certain sound information by applying compression and bass-boost effects.

45. The tactile device according to claim 11, wherein a digital signal processor in the circuit assembly in conjunction with a signal from an I/O port provides car-engine feedback sounds to simulate the sensation of driving a combustion-engine-car or the sensation for safety alerts.

46. The tactile device of claim 1, wherein the primary membrane and the secondary membrane provide a controlled gradient of dissipation and transmission of the motion from the electroactive components.

47. The tactile device of claim 1, wherein the primary membrane is rigid, and the secondary membrane comprises a microcellular material.

48. The tactile device of claim 1, wherein the inverted T shape includes a first member and a second member perpendicular to and extending away from the first member, and wherein the electroactive components comprise:
a first electroactive component located at an axis of the first member of the inverted T shape; and
a second electroactive component located at an axis of the second member of the inverted T shape.

49. A tactile device, comprising:
one or more layers of primary membrane of a vibrotactile assembly, the primary membrane adapted to be proximal to a user;
one or more layers of secondary membrane of the vibrotactile assembly, the second membrane in a capital I shape and attached to said primary membrane; and
one or more discrete or continuous electroactive components that translate an electrical signal into motion, the electroactive components attached along or embedded into a portion of the secondary membrane,
the secondary membrane being between the electroactive components and the primary membrane, and the secondary membrane dampening and dissipating the motion from the electroactive components along a surface area of the secondary membrane, and
the primary membrane adapted to collect and transfer the damped and dissipated motion from the secondary membrane to the user.

50. The tactile device of claim 49, wherein the capital I shape includes a first member, a second member parallel to the first member, and a third member connecting the first member and the second member, and wherein the electroactive components comprise:
a first electroactive component located at an axis of the first member of the capital I shape; and
a second electroactive component located at an axis of the second member of the capital I shape.

* * * * *